United States Patent [19]
Schank

[11] 4,009,032
[45] Feb. 22, 1977

[54] PROCESS FOR PREPARING WATERLESS PRINTING MASTERS COMPRISING COPOLYMER OF SILOXANE AND THERMOPLASTIC BLOCKS

[75] Inventor: Richard L. Schank, Webster, N.Y.

[73] Assignee: Xerox Corporation, Stamford, Conn.

[22] Filed: Oct. 23, 1974

[21] Appl. No.: 517,347

[52] U.S. Cl. .................... 96/33; 96/1.4; 101/457; 101/462; 101/466

[51] Int. Cl.$^2$ .................... G03F 7/02; G03G 13/14

[58] Field of Search .................. 96/33, 115 R, 36.3, 96/1.3, 1.4, 1.5; 101/457, 462, 466; 204/17

[56] References Cited

UNITED STATES PATENTS

| | | | |
|---|---|---|---|
| 3,511,178 | 5/1970 | Curtin | 96/33 |
| 3,677,178 | 7/1972 | Gipe | 96/36.3 |
| 3,775,115 | 11/1973 | Sorkin et al. | 96/33 |
| 3,859,090 | 1/1975 | Yoerger et al. | 96/1.5 |
| 3,865,588 | 2/1975 | Onto et al. | 96/33 |
| 3,886,865 | 6/1975 | Onto et al. | 96/33 |
| 3,890,149 | 6/1975 | Schlesinger et al. | 96/115 R |
| 3,894,873 | 7/1975 | Kobayashi et al. | 96/33 |

*Primary Examiner*—Edward C. Kimlin
*Attorney, Agent, or Firm*—James J. Ralabate; James P. O'Sullivan; Donald M. MacKay

[57] ABSTRACT

Improved waterless lithographic plates are provided. The master which comprises a copolymer of siloxane blocks crosslinked to an elastomeric ink releasing condition and organic thermoplastic blocks which are ink accepting is imaged with a particulate material, preferably an ink accepting thermoplastic polymer, and the thermoplastic blocks heated and cooled to bond the particulate imaging material thereto.

11 Claims, No Drawings

PROCESS FOR PREPARING WATERLESS PRINTING MASTERS COMPRISING COPOLYMER OF SILOXANE AND THERMOPLASTIC BLOCKS

BACKGROUND OF THE INVENTION

This invention relates to a novel waterless lithographic master of the planographic type, a method for preparing said master and to a method for printing from said master.

In conventional lithography, an aqueous fountain solution is employed to prevent the ink from wetting the nonimaged areas of the planographic plate. It has recently been discovered that the requirement for a fountain solution can be obviated by employing a planographic plate having a silicone, i.e., organopolysiloxane, elastomeric layer. Because the silicone is not wetted by the printing ink, no fountain solution is required. While the use of silicone elastomers as a printing surface has obviated the requirement for a fountain solution, it has been found that finely divided particulate material commonly referred to in the trade as "toner", is not easily attached to the silicone. Thus, the adhesive or nonadhesive property of the silicone which renders it useful for rejecting lithographic inks, also causes it to reject other materials such as toner. Accordingly, it has been difficult to prepare a printing master in which the toner could be sufficiently attached to the silicone such that it would not become removed after a short run on a printing press. It is this problem to which this invention is directed.

BRIEF DESCRIPTION OF THE INVENTION

It has now been discovered that a master comprising a conventional substrate and an overlying layer of a copolymer having siloxane blocks crosslinked to an ink releasing elastomeric condition, and ink accepting organic thermoplastic blocks, can be imaged with particulate imaging material and the thermoplastic blocks softened and then hardened to bond the particulate imaging material thereto. Thus, the thermoplastic blocks permit the imaging material to be physically bonded thereto and the siloxane blocks provide an insoluble ink releasing background area so that no dampening or fountain solution is required. In a preferred embodiment, the particulate imaging material is a material which can be selectively solvated and removed from the master surface to permit reimaging and reuse of the master.

DETAILED DESCRIPTION OF THE INVENTION

Typical materials which include the types of master materials as well as detailed instructions for preparing the masters are herein discussed in detail.

Substrates which can be employed for the printing master are those self-supporting materials to which the copolymer can adhere and be compatible therewith as well as possess sufficient heat and mechanical stability to permit use under widely varying conditions. Exemplary of suitble substrates are paper; metals such as aluminum; plastics such as polyesters, polycarbonates, polysulfones, nylons and polyurethanes.

When a substrate which is nonphotoconductive is employed, the substrate can be coated with a photoconductive material by conventional means such as draw bar coating, vacuum evaporation and the like. A thickness of between 0.02 and 20 microns is conventional. Typical inorganic crystalline photoconductors include cadmium sulfide, cadmium sulfoselenide, cadmium selenide, zinc sulfide, zinc oxide, and mixtures thereof. Typical inorganic photoconductive materials include amorphous selenium, and selenium alloys such as selenium-tellurium, and selenium-arsenic. Selenium may also be used in its hexagonal crystalline form, commonly referred to as trigonal selenium. Typical organic photoconductors include phthalocyanine pigments such as the X-form of metal free phthalocyanine described in U.S. Pat. No. 3,357,989 to Byrne et al, and metal phthalocyanine pigments, such as copper phthalocyanine. Other typical organic photoconductors include polyvinyl carbazole, trinitrofluorenone and photoinjecting pigments such as benzimidazole pigments, perylene pigments, quinacridone pigments, indigoid pigments and polynuclear quinones. Alternatively, the photoconductor can be dispersed in a binder of one of the aforesaid polymeric substrate materials to serve as the ink accepting substrate.

The surface copolymer layer is formed of polysiloxane groups which can be cured to an ink releasable elastomeric condition and organic thermoplastic blocks which can be alternately softened and hardened so as to bond the particulate imaging material thereto. The siloxane blocks can be those having only alkyl containing groups in the polymer chain such as polydimethylsiloxane or polydiethylsiloxane; gums having both alkyl and phenyl containing groups in the polymer chain as well as gums having both alkyl and vinyl groups, alkyl and fluorine groups or alkyl, phenyl and vinyl groups in the polymer chain. The organic materials employed to form the thermoplastic blocks in the copolymer are conventional thermoplastic monomers such as styrene, alpha-methylstyrene, styrene/n-butyl methacrylate, and styrene-butadiene.

While not limiting, preferred proportions for the copolymer comprise a ratio by weight of between about 50–99 parts polysiloxane to 1 to 50 parts of the thermoplastic blocks. A most preferred ratio is from about 80–90 parts polysiloxane groups so as to insure that the polysiloxane is preferentially crosslinked. A catalyst which will preferentially cure the siloxane blocks is also preferably employed. Typical catalysts include the peroxides such as benzoyl peroxide and the like, the particular catalyst depending upon the silicone employed. Suitable catalysts are provided by the manufacturers of the silicone gums. Copolymers of the above type, can be prepared in the manner illustrated by the procedure for preparation of an organopolysiloxane polystyrene block copolymer as described in Macromolecules, Volume 3, January–February 1970, pages 1–4, which is herein incorporated by reference in its entirety.

The copolymer can be coated on the substrate by conventional means such as draw bar coating, preferably with a catalyst in a suitable solvent and the solvent allowed to evaporate. The siloxane blocks can then be preferentially cured, such as by heat, to activate the catalyst to a crosslink density of between about 0.5 and about 5 percent. The amount of crosslinking will depend upon the particular polymer employed but preferably the siloxane blocks are cured sufficiently such that the copolymer is ink releasing but not so much that the thermoplastic blocks become cured so that the particulate imaging material cannot be physically bonded thereto.

After the siloxane are cured, the master can be imaged by conventional means such as electrostatographic imaging, either directly on the master and developed thereon, or formed and developed on a separate photoconductive surface and transferred to the master surface. The particulate imaging material can be any conventional ink accepting material commonly referred to in the art as toner. Typical toners include thermoplastic polymers such as polyethylene, polyesters and polymers of styrene. Typical polymers of styrene include polystyrene, styrene/n-butyl methacrylate copolymer and styrene-butadiene copolymer. Other materials which can be employed include: polypropylene, ethylene-vinyl acetate copolymers, polyamides, polyimides, phenoxies, polyesters and vinyls. Although it is preferred, the imaging material need not be thermoplastic. Typical nonthermoplastic materials are carbon black, and inorganic salts, which can also be employed. After the master is imaged, the particulate material can be fixed by heating the master to soften the thermoplastic blocks and then cooling or allowing the blocks to cool so as to harden and bond the particulate imaging material thereto.

The imaged printing master can then be employed on conventional planographic printing equipment by direct or offset means with the dampening system removed to provide good quality prints over an extended period of operation with conventional inks of the oleophilic, glycol or rubber based type. If desired, the master can be reimaged by removing the particulate imaging material with a suitable solvent and the thermoplastic blocks softened to deposit a new imaging material.

The following examples will serve to illustrate the invention and embodiments thereof. All parts and percentages in said examples and elsewhere in the specification and claims are by weight unless otherwise specified.

EXAMPLE I

A printing master is prepared and prints obtained therefrom as follows. A coating solution consisting of 25.0 grams of a 10 weight percent solution of a 90/10 polydimethylsiloxane/poly(alpha-methylstyrene) multiblock copolymer in benzene blended with 0.05 gram of a 50 percent by weight paste of benzoyl peroxide in silicone oil is draw bar coated on a grained aluminum lithographic master ($10 \times 15 \times 0.006$ in.) and air dried to a film thickness of about 6–8 microns. The plate is covered to exclude air and then placed on a hot metal shelf for several minutes at 170° – 175° C in an oven to initiate the crosslinking reaction of the siloxane. The plate is then allowed to cool to room temperature. The plate is imaged employing a Xerox Model D processor, the image developed on a selenium flat plate with Xerox 2400 toner comprising a thermoplastic copolymer of styrene/n-butyl methacrylate and the developed image electrostatically transferred to the surface of the cured block copolymer. The toner image is cofused with the heat sensitive organic poly(alpha-methylstyrene) blocks by placing the plate on a hot metal shelf at 180° C in an air oven for 1 minute and then the plate allowed to cool to room temperature. Attempts to remove the fused toner by alternately applying and removing scotch tape to the imaged area are unsuccessful, indicating excellent toner adhesion. The plate is then employed on a Davidson Dual-a-matic printing press operating in the direct mode with Ronico rubber base ink XL 91779, and no fountain solution, and 400 excellent prints generated having high print density and low background contamination without any apparent wear of the printing plate.

EXAMPLE II

The procedure of Example I is repeated but for the exception that the fused image is removed by washing the plate with isopropyl alcohol, the plate reimaged and an additional 400 excellent prints obtained therefrom without any apparent wear of the printing plate.

EXAMPLE III

The procedure of Example I is repeated but for the exception that the multiblock copolymer employed is a copolymer of dimethylsiloxane and styrene blocks in a weight ratio of 80:20.

Having described the present invention with reference to these specific embodiments, it is to be understood that numerous variations can be made without departing from the spirit of the invention and it is intended to include such reasonable variations and equivalents within the scope.

What is claimed is:

1. A method of preparing a printing master comprising coating a master substrate with a copolymer having from 50–99% by weight siloxane blocks which are curable to an elastomeric ink releasable condition and organic ink accepting blocks which are thermoplastic when heated, selectively curing the siloxane blocks so as to render the polymer ink releasing but wherein the organic thermoplastic blocks are substantially uncrosslinked, depositing an ink accepting particulate material on said master in image configuration, and heating said coating to soften the organic thermoplastic blocks and allowing the coating to cool so as to bond the particulate imaging material to the master.

2. The process of claim 1 wherein the particulate imaging material deposited is a thermoplastic polymer.

3. The process of claim 1 wherein the imaging material is deposited prior to curing of the siloxane blocks.

4. The process of claim 1 wherein the copolymer comprises poly(alpha-methylstyrene) and polydimethylsiloxane blocks.

5. The process of claim 1 wherein the copolymer comprises polystyrene and polydimethylsiloxane blocks.

6. The process of claim 1 wherein the copolymer is coated on the master substrate with a catalyst.

7. The process of claim 6 wherein the catalyst is a peroxide catalyst.

8. The process of claim 1 wherein the image is formed and developed directly on the master.

9. The process of claim 1 wherein the image is formed and developed on a separate photoconductive substrate and electrostatically transferred to the printing master.

10. The process of claim 1 wherein the master substrate is aluminum.

11. The process of claim 1 wherein subsequent to imaging, the particulate imaging material is removed by washing with a preferential solvent and the master is reimaged.

* * * * *